US006167100A

United States Patent [19]

Eastty et al.

[11] Patent Number: 6,167,100

[45] Date of Patent: Dec. 26, 2000

[54] DIGITAL SIGNAL PROCESSING

[75] Inventors: Peter Charles Eastty, Oxford; Christopher Sleight, Chipping Norton; Peter Damien Thorpe, Oxford, all of United Kingdom

[73] Assignees: Sony Corporation, Tokyo, Japan; Sony United Kingdom Limited, Weybridge, United Kingdom

[21] Appl. No.: 08/979,819

[22] Filed: Nov. 26, 1997

[30] Foreign Application Priority Data

Nov. 27, 1996 [GB] United Kingdom .................. 9624702

[51] Int. Cl.$^{7}$ ............................ H04L 7/00; H03M 3/00; H04M 1/64

[52] U.S. Cl. ......................... 375/372; 341/143; 379/67.1

[58] Field of Search .................................... 375/372, 373, 375/371; 341/143; 379/67.1

[56] References Cited

U.S. PATENT DOCUMENTS

| | | | |
|---|---|---|---|
| 4,071,845 | 1/1978 | Gross | 343/113 |
| 4,829,523 | 5/1989 | Bretl | 371/31 |
| 5,557,648 | 9/1996 | Ishihara | 375/376 |
| 5,737,570 | 4/1998 | Koch | 395/476 |
| 5,752,178 | 5/1998 | Yamamoto | 455/186.1 |

*Primary Examiner*—Chi H. Pham
*Assistant Examiner*—Khai Tran
*Attorney, Agent, or Firm*—Frommer Lawrence & Haug, LLP.; William S. Frommer; Dexter T. Chang

[57] ABSTRACT

One-bit digital signal processing apparatus for generating an output one-bit signal by switching from a first to a second one-bit signal in response to a detection that m consecutive bits of the first and second signal are identical, the apparatus comprising means for varying m in dependence on the urgency of the switching operation.

10 Claims, 2 Drawing Sheets

DIGITAL SIGNAL PROCESSING

BACKGROUND OF THE INVENTION

1. Field of the Invention

This invention relates to digital signal processing.

2. Description of the Prior Art

In a digital switching apparatus such as a digital audio mixer, when a switch (or "cut") is to occur from one digital audio signal to another, it is usual to apply the cut when the two signals are the same. Even though this leads to a delay between initiation and implementation of the cut, the requirement that both signals are the same reduces the magnitude of an audible "click" generated by the cut.

With a multibit PCM (pulse code modulated) audio signal, it is relatively straightforward to detect when the two signals are the same, simply by comparing the numerical values of corresponding PCM samples for the two signals.

For one-bit digital audio signals, an appropriate test is that the two one-bit signals are the same over a number of corresponding successive bits. However, if the requirement is that m bits are identical in the two signals, then statistically there will be an average delay of $2^m$ samples before this will occur. For example, if the requirement is that 14 bits are to be identical the average delay before this will next occur is about 5 milliseconds in a 64 fs system[1]. However, this delay period is not bounded.

1 Here, fs refers to an sampling rate of, for example, 44.1 kHz or 48 kHz. The one-bit digital audio signal in this example has a bit rate of 64 fs, or 2.8224 or 3.072 MHz rectively.

So, this leads to two conflicting requirements for deciding when to implement a cut between the two signals. Although it is better to wait for a large number of corresponding bits in the two signals to be identical before implementing the cut, it is undesirable to impose a long delay after the cut control is operated before the cut takes effect.

Similar problems can occur when two one-bit audio signals having separate clocking sources are being processed by a single piece of equipment, it is normal that the two clocks will have slightly different frequencies, within the tolerances defined by the formats of the digital signals. This means that clocking differences (expressed in numbers of bits or numbers of clock cycles) will tend to build up between the two signals.

A certain number of such errors can be handled by an input buffer, but of course a buffer has only a limited size. So, the normal way of dealing with such errors is to drop or repeat samples from the input signal. This process is generally known as "clock slipping".

In order to reduce the audible effect of clock slipping, it is better to drop or repeat a sample when the input signal and itself displaced by the number of dropped or repeated samples are substantially identical over a number of consecutive samples.

For one-bit signals, if the requirement is that m bits are identical between the signal and the displaced signal, then statistically there will be an average delay of $2^m$ samples before this will occur. For example, if the requirement is that 14 bits are to be identical the average delay before this will next occur is about 5 milliseconds in a 64 fs system.

During this time delay (which is not bounded) further clocking errors could build up to the extent that the buffer capacity can be exceeded. However, if a very relaxed criterion is used to give a quicker response (e.g. a requirement that only a few bits must be identical) then the clock slipping operation can produce subjectively disturbing sounds (e.g. clicks) when samples are dropped or repeated.

SUMMARY OF THE INVENTION

This invention provides one-bit digital signal processing apparatus for generating an output one-bit signal by switching from a first to a second one-bit signal in response to a detection that m consecutive bits of the first and second signal are identical, the apparatus comprising means for varying m in dependence on the urgency of the switching operation.

Here, the "urgency" could be, for example, the time elapsed since a switching operation was initiated, or the number of bit periods of phase discrepancy between an input and an output clock. So, the criterion for considering the two signals "identical" is relaxed as the operation becomes more urgent.

Embodiments of the invention provide one-bit digital switching apparatus for generating an output one-bit signal by switching from a first to a second input one-bit signal at or after a desired switch time, the apparatus comprising:

means for setting a control value, m, to a predetermined initial value integer at the desired switch time;

means for detecting whether corresponding m-bit sequences of the first and second one-bit signals are identical;

means, responsive to a detection that the corresponding m-bit sequences of the first and second one-bit signals are identical, for switching from the first to the second one-bit signals; and means for progressively decreasing the value of m with elapsed time since the desired switch time.

In the invention, the two apparently conflicting requirements described above are both addressed.

When a cut or switching operation is initiated, the criterion for judging whether the two signals are sufficiently identical to execute the switching operation is made to be relatively severe, in that a large number of successive corresponding bits must be identical.

However, as time goes on, the criterion is progressively relaxed, so that fewer and fewer bits are required to be identical in the two signals.

In embodiments of the invention, eventually, at a predetermined time from initiation of the switching operation (e.g. 10 milliseconds), the requirement can be reduced so that only one bit of the two signals must be identical—a criterion which is fulfilled practically instantaneously.

This arrangement means that if the two signals are sufficiently identical, the cut will occur quickly and with a reduced click. However, in embodiments of the invention, an upper limit (in this case, 10 milliseconds) may be placed on the length of time which can occur before the cut is implemented.

Embodiments of the invention provides apparatus for synchronising the phase of a one-bit digital signal having an input bit rate to the phase of an output clock by discarding or repeating data bits of the one-bit signal to compensate for phase discrepancies between the input bit rate and the output clock, the apparatus comprising:

a buffer for receiving bits of the one-bit signal and for outputting bits of the one-bit signal according to the output clock;

means for detecting the number of bit periods of the output clocking signal by which the input bit rate is out of phase with the output clock;

means for setting a control value, m, to an integer value dependent on the number of bit periods, so that m is lower for higher numbers of bit periods;

means for detecting whether a first m-bit sequence of the one-bit signal is identical with a corresponding m-bit sequence displaced by n bits with respect to the first m-bit sequence; and means, responsive to a detection that the corresponding m-bit sequences of the one-bit signal are identical, for discarding or repeating n bits on output of the one-bit signal from the buffer, to reduce the phase discrepancy between the input bit rate and the output clock.

With the invention, and in particular these embodiments, the two apparently conflicting requirements described above are addressed.

When the current clocking error is relatively small (e.g. a small proportion of the buffer size) a severe criterion for clock slipping is imposed by requiring a large number of bits to be identical before one or more samples can be dropped or repeated.

However, as the number of samples of the clocking errors increases and the buffer size is used up, the criterion is progressively relaxed, so that fewer and fewer bits are required to be identical between the signal and the displaced signal. In embodiments of the invention, eventually, when the buffer is practically full, the requirement may simply be that one bit of the two signals must be identical—a criterion which is fulfilled practically instantaneously.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
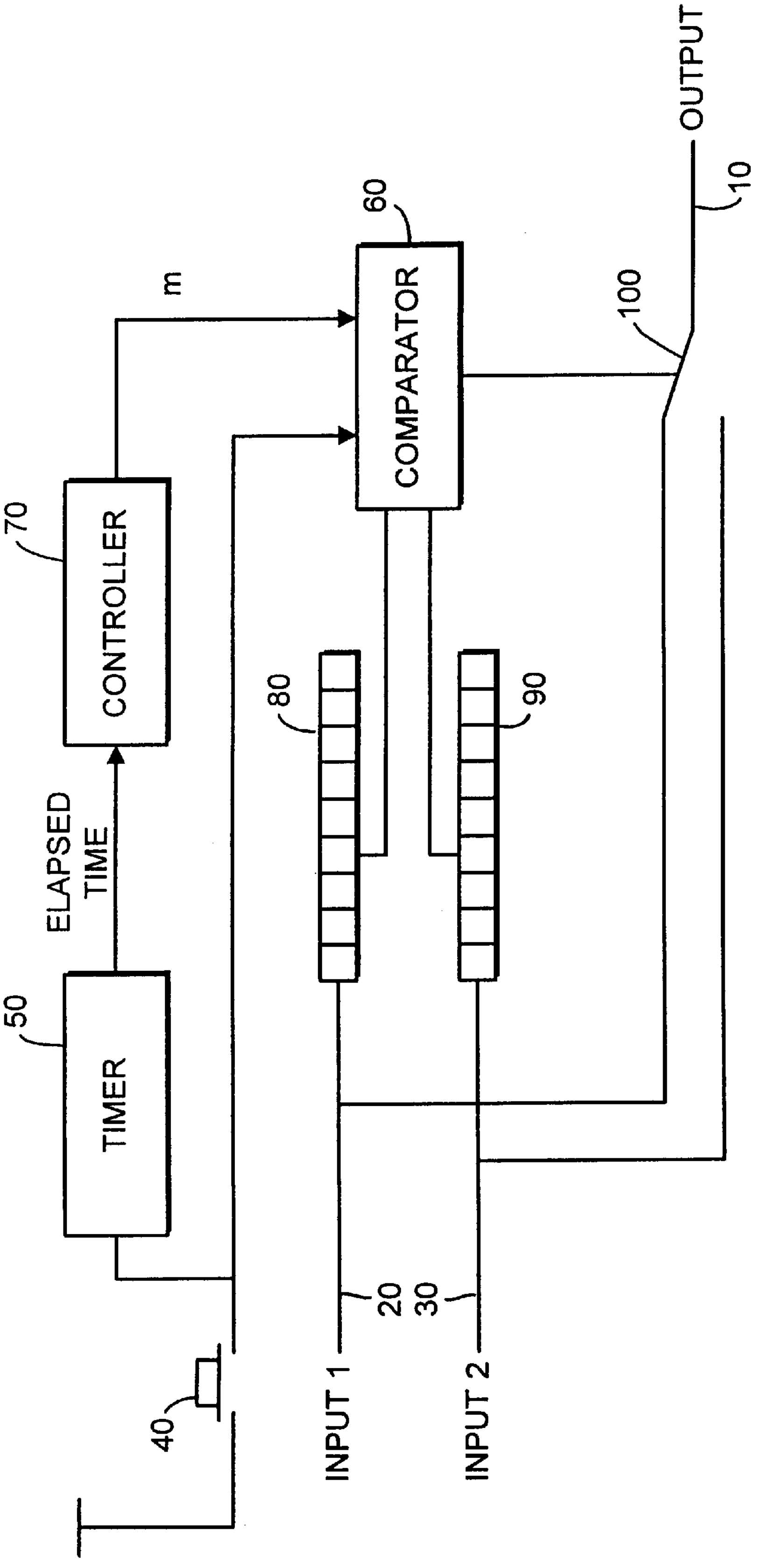
FIG. 1 is a schematic diagram of a one-bit digital switching apparatus.

Referring to the drawings, FIG. 1 is a schematic diagram of a one-bit digital switching apparatus for generating an output one-bit signal 10 by switching between a pair of input one-bit digital signals 20, 30.

The switch operation between the two input signals is initiated by a user pressing a control button 40, connected to a timer 50 and to a comparator 60. The output of the timer 50 is connected to a controller 70 which generates a control value m in response to a signal from the timer 50 indicative of the elapsed time since the control button 40 was pressed and the switch operation was initiated.

The two input signals 20,30 are supplied in parallel to shift register buffers 80,90 and to a switch 100 under control of the comparator 60.

The operation of the apparatus of FIG. 1 is as follows. The comparator 60 controls the operation of the switch 100 to switch between the two input signals 20, 30. In order for the switch to take place, the comparator 60 requires that m bits of the two input signals 20, 30 (as stored in the shift register buffers 80, 90) are identical.

The control value m (the number of bits which must be identical) is set by the controller 70 in response to the elapsed time since the switching operation was initiated. When the switching operation is first initiated, the control value m is set to a relatively large number of bits, e.g. 20 bits. With time, the control value m is reduced progressively. For example, the value m could decrease in a linear relation to increasing elapsed time. At a predetermined time after the switching event was initiated, considered to be the maximum time for which the switching operation can be delayed, the control value m reaches a very low number such as one bit. (The requirement for one bit of each of the two input signals to be identical is met substantially instantaneously).

Figure 2:
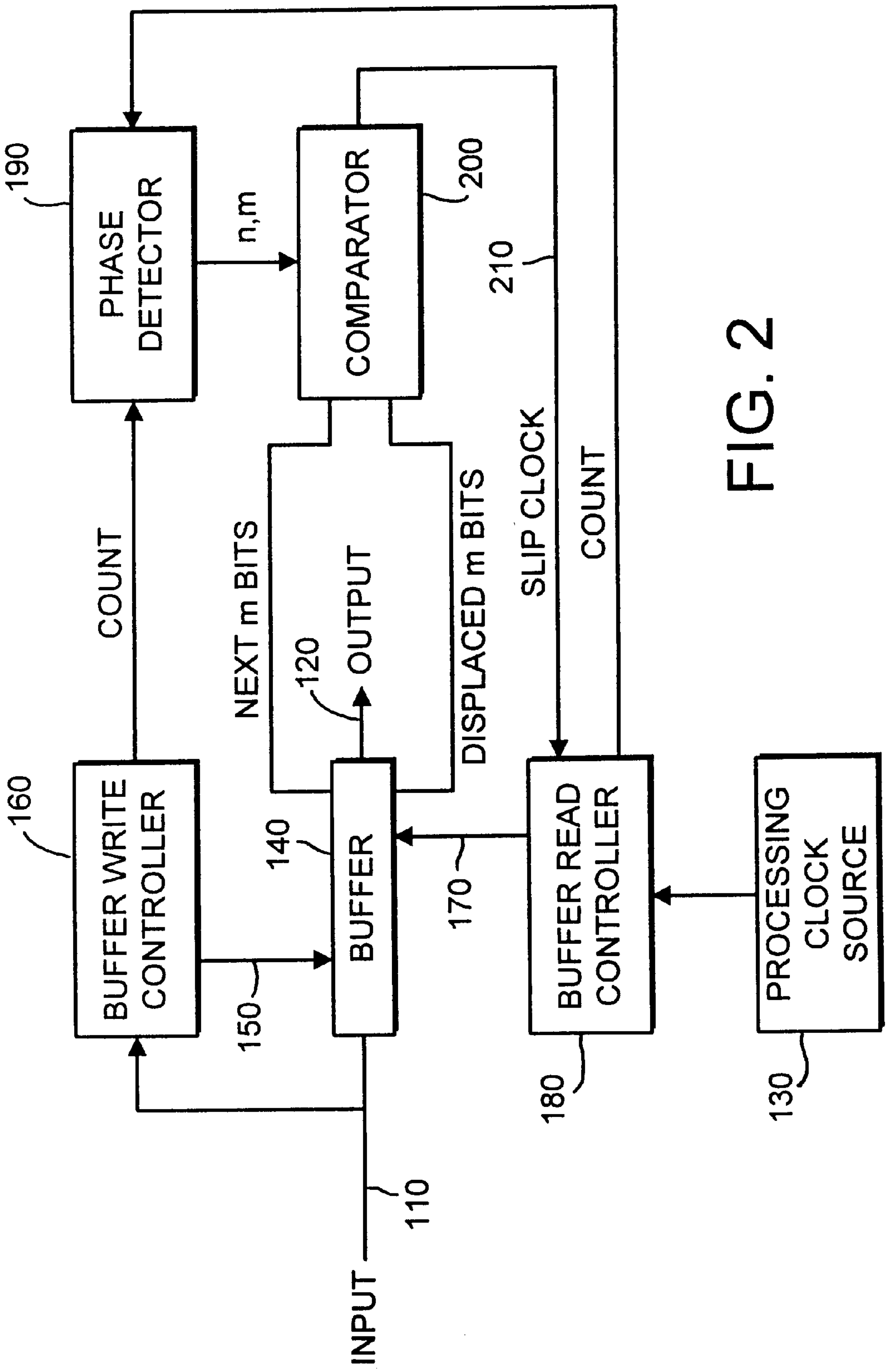
FIG. 2 schematically illustrates a one-bit digital signal synchronisation apparatus.

Referring to FIG. 2, the apparatus shown might form an input stage of, for example, a digital audio mixing console or other audio processing device.

The apparatus of FIG. 2 receives an input one-bit digital signal 110 and supplies an output one-bit digital signal 120. The input signal is clocked according to an input clock source and the output signal 120 is clocked according to a processing clock source 130 (which may be internal or external to the apparatus of FIG. 2). Generally, the input clock source and the processing clock source are nominally the same bit rate, but deviate within the tolerances allowed by the particular digital signal transmission format in use.

The input signal is buffered in a buffer 140. This is the type of buffer where the position at which the next received input bit is to be written is controlled by a write pointer 150 (in turn controlled by a buffer write controller 160) and the position at which bits of the output signal are read from the buffer is similarly controlled by a read pointer 170 under the control of a buffer read controller 180. Basically, as each bit is written to the buffer 140, the write pointer 150 is advanced by one bit, and as each bit is read from the buffer 140, the read pointer 170 is advanced by one bit.

It is desirable to keep a certain amount of data in the buffer at any time. For example, for a total buffer size of, say, 100 bits, the system could be set up to aim for the buffer to hold perhaps 50 bits of the input signal at any time. This allows the buffer then to compensate for positive or negative clocking errors between the input and output clocks; if the input bits are received faster than they are required at the output, then more bits can be held in the buffer; conversely, if the output bits are required faster than they are received at the input, then the number of bits held in the buffer can be allowed to decrease. However, these are essentially temporary measures; to return the buffer to its desired occupancy it will generally be necessary to repeat or discard bits in the output signal—i.e. a clock slipping process.

A phase detector 190 receives respective count signals from the buffer write controller 160 and the buffer read controller 180. In this way, the phase detector 190 is able to detect any discrepancies between the rate at which bits are written into the buffer and the rate at which they are read from the buffer to form the output signal, given the overall aim of maintaining the desired occupancy level in the buffer.

If discrepancies are detected, the phase detector 190 generates an output value n, being the number of bits by which the input and output clock sources have become out of phase. The phase detector 190 also generates a control value m, to be discussed below.

The control values n and m are supplied to a comparator 200 which accesses the buffer 140 to compare the next m bits to be output with a group of m adjacent bits in the buffer, displaced from the next m bits for output by a displacement of n bits. The displaced group is displaced in a direction so that the phase discrepancy is reduced. So, if the input bits are received faster than they are required at the output, then bits are dropped to correct this discrepancy and vice versa.

If the two groups of m bits are detected to be identical, the comparator issues a slip clock signal 210 to instruct the buffer read controller 180 to move the position of the read pointer 170 so as to discard or repeat m bits in the output signal.

One example of the relationship between n and m is shown in the following table:

| n (number of clock errors) | m (number of bits required to be identical) |
|---|---|
| 1–3 | 15 |
| 4–7 | 13 |
| 8–10 | 11 |
| 11–15 | 9 |
| 16–20 | 7 |
| 21–25 | 5 |
| 26–30 | 3 |
| over 30 | 1 |

So, the value of m is lower for higher values of n.

In other embodiments, the number of bits "slipped" (n) need not be the same as the phase error between the input and output clocks. It could be smaller, in which case partial compensation could occur, or larger, in which case over compensation would occur. However, the relationship between the phase error and m, the number of bits required to be identical, would remain as described above.

Thus, embodiments of the invention provide apparatus for switching from one signal to another (in one case, a different signal, and in another case, a delayed or advanced version of the first signal), in which a test is applied to detect whether m consecutive bits of the two signals are the same, where the value m is varied in dependence on the urgency of the switch-over.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A one-bit digital signal processing apparatus, comprising:

means for generating an output one-bit signal by switching from a first to a second one-bit signal in response to a detection that a number, m, of consecutive bits of said first and second signal are identical; and logic means for varying the number m in dependence on the urgency of the switching.

2. An apparatus according to claim 1, wherein said logic means is operable to vary the number m according to a generally inverse function of an elapsed time of said switching.

3. An apparatus according to claim 1, wherein said second one-bit signal is an asynchronous version of said first one-bit signal, said logic means being operable to vary the number m according to a generally inverse function of a phase discrepancy between said output one-bit signal and an output clock.

4. An apparatus according to claim 1, in which said one-bit digital signal is a one-bit digital audio signal.

5. A one-bit digital switching apparatus for generating an output one-bit signal by switching from a first to a second input one-bit signal at or after a desired switch time, said apparatus comprising:

means for setting a control value, m, to a predetermined initial value integer at said desired switch time;

means for detecting whether corresponding m-bit sequences of said first and second one-bit signals are identical;

means, responsive to a detection that said corresponding m-bit sequences of said first and second one-bit signals are identical, for switching from said first to said second one-bit signals; and means for progressively decreasing the value of m with elapsed time since said desired switch time.

6. An apparatus according to claim 5, in which said value of m is decreased in a substantially linear relation to elapsed time since said desired switching time.

7. An apparatus according to claim 5, in which said first and second one-bit digital signals are each one-bit digital audio signals.

8. An apparatus for synchronising the phase of a one-bit digital signal having an input bit rate to the phase of an output clock by discarding or repeating data bits of said one-bit signal to compensate for phase discrepancies between said input bit rate and said output clock, said apparatus comprising:

a buffer for receiving bits of said one-bit signal and for outputting bits of said one-bit signal according to said output clock;

means for detecting a number of bit periods of the output clocking signal by which said input bit rate is out of phase with said output clock;

means for setting a control value, m, to an integer value dependent on said number of bit periods, so that m is lower for higher numbers of bit periods;

means for detecting whether a first m-bit sequence of the one-bit signal is identical with a corresponding m-bit sequence displaced by n bits with respect to said first m-bit sequence; and means, responsive to a detection that said corresponding m-bit sequences of the one-bit signal are identical, for discarding or repeating n bits on output of said one-bit signal from the buffer, to reduce said phase discrepancy between said input bit rate and said output clock.

9. An apparatus according to claim 8, in which n is equal to the number of bit periods by which said input bit rate is out of phase with said output clock.

10. An apparatus according to claim 8, in which said detecting means is operable to detect phase discrepancies with respect to a desired occupancy of said buffer.

* * * * *